United States Patent [19]
Peters et al.

[11] Patent Number: 5,997,658
[45] Date of Patent: Dec. 7, 1999

[54] AQUEOUS STRIPPING AND CLEANING COMPOSITIONS

[75] Inventors: Darryl W. Peters, Stewartsville, N.J.; Irl E. Ward, Bethlehem, Pa.; Francis Michelotti, Easton, Pa.; Floyd Riddle, Jr., Emmaus, Pa.

[73] Assignee: Ashland Inc., Dublin, Ohio

[21] Appl. No.: 09/004,937

[22] Filed: Jan. 9, 1998

[51] Int. Cl.$^6$ ....................................................... B08B 7/00
[52] U.S. Cl. .................... 134/38; 134/1.3; 134/2; 134/40; 510/175; 510/176; 510/202; 510/203; 510/212; 510/401; 510/402
[58] Field of Search .................... 134/1.3, 2, 38, 134/40, 42; 430/329; 510/175–176, 202–203, 212, 401, 402, 499, 505

[56] References Cited

U.S. PATENT DOCUMENTS 5,563,119  10/1996  Ward ........................................ 510/176
5,597,420  1/1997  Ward ......................................... 134/38
5,795,702  8/1998  Tanabe et al. ....................... 430/329 X

FOREIGN PATENT DOCUMENTS 669151  8/1993  Australia .
9-96911  4/1997  Japan .

Primary Examiner—Arlen Soderquist
Attorney, Agent, or Firm—John Lezdey & Assoc.

[57] ABSTRACT

An aqueous stripping composition comprising a mixture of an organic amine and a corrosion inhibitor which is benzotriazole alone or in combination with gallic acid, its ester or analog. The stripping composition is effective to strip photoresists, residues from plasma process generated organic, metal-organic materials, inorganic salts, oxides, hydroxides or complexes in combination with or exclusive of organic photoresist films at low temperatures with little corrosion of copper or titanium containing substrates.

3 Claims, 2 Drawing Sheets

5,997,658

AQUEOUS STRIPPING AND CLEANING COMPOSITIONS

FIELD OF THE INVENTION

This invention provides an improvement over the compositions of U.S. Pat. No. 5,597,420. More particularly, this invention relates to an improvement in aqueous stripping compositions particularly useful for stripping paints, varnishes, enamels, photoresists and the like, from various substrates. The invention relates to improved aqueous stripping compositions comprising organic amines, particularly, alkanolamines by providing a corrosion inhibitor which is benzotriazole alone or in combination with gallic acid or a gallic acid ester. The compositions do not include hydroxylamine.

BACKGROUND OF THE INVENTION

During manufacture of semiconductors and semiconductor microcircuits, it is frequently necessary to coat the substrates from which the semiconductors and microcircuits are manufactured with a polymeric organic film, generally referred to as a photoresist, e.g., a substance which forms an etch resist upon exposure to light. These photoresists are used to protect selected areas of the surface of the substrate, while the etchant selectively attacks the unprotected area of the substrate. The substrate is typically a silicon dioxide coated silicon wafer and may also contain metallic microcircuitry, such as aluminum or alloys, on the surface. Following completion of the etching operation and washing away of the residual etchant, it is necessary that the resist be removed from the protective surface to permit essential finishing operations. It is desirable to develop an improved stripping composition to remove the organic polymeric substrate from a coated inorganic substrate without corroding, dissolving or dulling the metal circuitry or chemically altering the wafer surface.

Stripping compositions used for removing coatings from photoresists and other substrates have for the most part been highly flammable, generally hazardous to both humans and the environment, and reactive solvent mixtures exhibiting an undesirable degree of toxicity. Moreover, these stripping compositions are not only toxic, but their disposal is costly since they must be disposed of as a hazardous waste. In addition, these prior stripping compositions generally have severely limited bath life and, for the most part, are not recyclable or reusable.

Generally, compositions containing chlorinated hydrocarbons and/or phenolic compounds or other highly caustic and corrosive materials have been employed as stripping compositions for stripping paints, varnishes, lacquers, enamels, photoresists, powder coatings and the like, from substrates such as wood, metal or silicon wafers. Hot caustic compositions are generally employed to remove coatings from metals and methylene chloride compositions to remove coatings from wood. In many cases, the components of the stripping compositions are relatively toxic reactive solvent mixtures and thus must be subject to stringent use conditions and require hazardous chemical handling procedures and wearing of safety garments and apparel by users so as to avoid contact with the stripping compositions.

Additionally, because many of the toxic components of such stripping compositions are highly volatile and subject to unduly high evaporation rates, the stripping compositions require special human and environmental safety precautions to be taken during storage and use of said compositions.

In photoresist stripping with the use of hydroxylamine and an amine solvent there is the problem with the substrate of titanium, copper and aluminum etching. It is therefore desirable to provide a corrosion inhibitor so that such compositions can be used on a various kinds of photoresists.

U.S. Pat. No. 4,276,186 to Bakos et al discloses a cleaning composition which includes N-methyl-2-pyrrolidone and an alkanolamine. However, in a comparative study, applicant has found that the use of N-methyl-2-pyrrolidone does not provide a broad spectrum of cleaning as is capable with the composition of the invention.

U.S. Pat. No. 4,617,251 to Sizensky discloses a stripping composition which is prepared with a select amine and an organic polar solvent. The composition is formed utilizing from about 2 to about 98% by weight of amine compound and about 98 to about 2% of an organic polar solvent.

U.S. Pat. No. 4,770,713 to Ward discloses a stripping composition comprising an alkylamine and an alkanolamine.

U.S. Pat. No. 5,419,779 to Ward discloses a process for removing an organic coating from a substrate by applying a composition consisting of about 62% by weight of monoethanolamine, about 19% by weight hydroxylamine, a corrosion inhibitor which includes gallic acid and gallic acid esters, and water.

U.S. Pat. No. 5,496,491 to Ward, which is incorporated herein by reference, discloses a photoresist stripping composition comprising a basic amine, a polar solvent and an inhibitor which is the reaction product of an alkanolamine and a bicyclic compound. However, gallic acid and gallic acid esters are not disclosed as inhibitors.

U.S. Pat. Nos. 5,334,32 and 5,275,771 to Lee disclose a composition containing hydroxylamine, an alkanolamine and a chelating agent. However, the chelating agent is not gallic acid or its esters.

U.S. Pat. No. 5,597,420 to Ward which is herein incorporated by reference discloses a stripping composition free of hydroxylamine compounds which consists essentially of monoethanolamine and water together with a corrosion inhibitor. The inhibitor includes gallic acid and its esters.

U.S. Pat. No. 4,617,251 to Sizensky, which is herein incorporated by reference, discloses organic amines that can be used in the compositions of the invention.

Recently, OSHA, EPA and other similar federal, state and local governmental regulatory agencies have advocated a shift toward use of more human and environmentally compatible stripping compositions and stripping methods that are not subject to the aforementioned drawbacks and problems.

Moreover, heretofore available photoresist stripping compositions have required unduly long residence times or repeated applications in order to remove certain coatings. In addition, various coatings have resisted removal from certain substrates with these heretofore available stripping compositions. That is, these previously available stripping compositions have not provided adequate or complete removal of certain hard-to-remove coatings from various substrates.

It is, therefore, highly desirable to provide stripping compositions that exhibit substantially no human or environmental toxicity, are water miscible and are biodegradable. It is also desirable to provide stripping compositions that are substantially non-flammable, non-corrosive, evidence relatively little, if any, tendency to evaporate and are generally unreactive and also of little toxicity to humans and are environmentally compatible.

Moreover, it would be desirable to provide photoresist stripping compositions that have a high degree of stripping efficacy and particularly such high degree of stripping at lower temperatures than generally required with prior stripping compositions.

It is also highly desirable that photoresist stripping compositions be provided that exhibit substantially no corrosive effects on the substrate, especially those containing copper, titanium and/or aluminum or silicon.

It is also desirable that effective stripping compositions be provided that are devoid of undesirable chlorinated or phenolic components and which do not require the use of hot caustic components. Highly desirable are stripping compositions and use thereof that are not considered undesirable by regulatory agencies overseeing their production and use.

It is also most advantageous that stripping compositions be provided with the above-identified desirable characteristics which evidence a stripping action results not always obtainable with the individual components for the removal of sidewall organometallic and metal oxide residues without any substantial corrosion of a copper or titanium substrate.

SUMMARY OF THE INVENTION

It has now been found that a suitable stripping and cleaning composition in which the hereinbefore mentioned disadvantages or drawbacks of corrosion are eliminated or substantially reduced particularly of copper or titanium substrates with the teachings of the present invention.

In a stripping composition containing the admixture of water, a soluble organic amine, the improvement which comprises in admixture therewith an effective amount of corrosion inhibitor which is benzotriazole alone or in combination with a compound of the general formula:

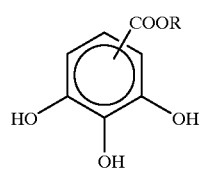

(I)

wherein R is hydrogen or lower alkyl.

A preferred amount of inhibitor alone or in combination is about 0.5 to 10% by weight. Advantageously, the amount of inhibitor is about 1 to 5% by weight.

The organic amine is present in an amount of about 60 to 90% by weight, preferably, about 70 to 85% by weight. The preferred organic amines are alkanolamine, and most preferably is N-methylethanolamine.

The novel stripping compositions of the invention exhibit synergistically enhanced corrosion inhibiting action and stripping capabilities at low temperatures not possible from the use of the individual components or in combination with other stripping components when the inhibitors are not present.

The stripping compositions of the invention provide an effective stripping action as well as enhanced copper, aluminum and titanium corrosion protection.

It is a general object of the invention to provide a non-corroding stripping composition which is effective at residue, polymer and contamination removal at low temperatures.

It is another object of the invention to provide a photoresist stripping composition which is non-corrosive especially of copper, copper alloys, aluminum, aluminum alloys and titanium.

It is a further object of the invention to provide a photoresist stripping composition which provides a low or negligible silicon etch rate.

It is still another object of the invention to provide an inhibitor which is less expensive and is more effective as a corrosion inhibitor than catechol or gallic acid or its esters alone.

It is yet another object of the invention to provide a method for stripping a coated substrate which can be accomplished at low temperatures which does not cause redeposition of metal ions.

Other objects and advantages of the present invention will be more fully understood in view of the accompanying drawing and a description of the preferred embodiments.

DETAILED DESCRIPTION OF THE PREFERRED EMBODIMENTS

Figure 1:
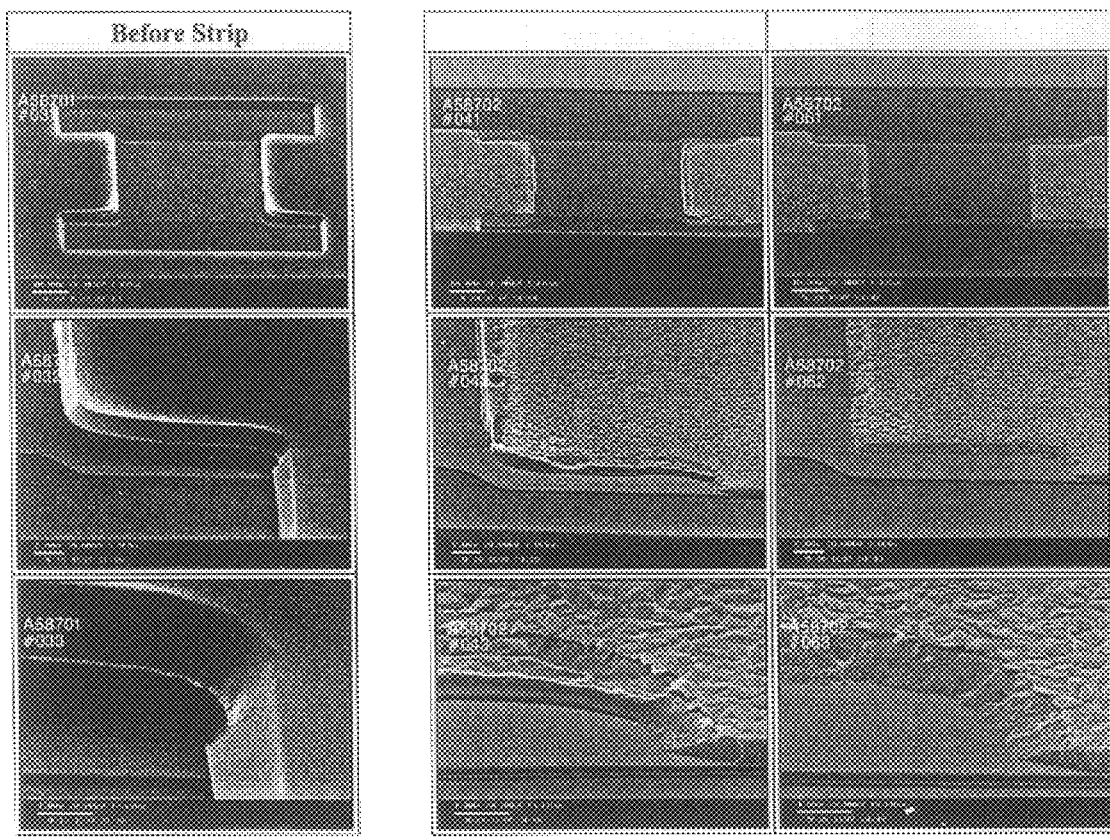
FIG. 1 shows a SEM comparison between a formulation of the invention with gallic acid and benzotriazole and a similar formulation with benzotriazole alone.

The aqueous stripping compositions of the invention preferably comprise an admixture of water and an organic amine in combination with about 0.5 to 10% by weight of a corrosion inhibitor system, preferably about 1 to 5% by weight, which is benzotriazole alone or in combination with a compound of the general formula:

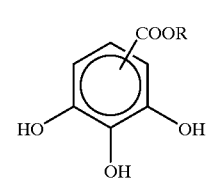

(I)

wherein R is hydrogen or lower alkyl.

A preferred photoresist stripping composition consists of about 70 to 85% by weight of an alkanolamine, most preferably, N-methylethanolamine, about 1 to 2.5% by weight of benzotriazole, about 1 to 2.5% by weight of gallic acid and water.

The alkanolamines which are useful in the invention are the lower alkanolamines which are primary, secondary and tertiary having from 1 to 5 carbon atoms. The alkanolamines include N-methylethanolamine (NMEA), monoethanolamine (MEA), diethanolamine, mono-, di- and triisopropanolamine, 2-(2-aminoethylamino) ethanol, 2-(2-aminoethoxy) ethanol, triethanolamine, and the like.

Other organic amines which can be used include cyclic non-aromatic amines such as morpholine, cyclohexylamine, and piperidine lower alkylamines such as butylamine, lower alkylene diamines such as ethylene diamine, and the like.

The stripping compositions of this invention are especially useful and advantageous for numerous reasons among which may be mentioned the following. The stripping compositions are water soluble, non-corrosive, non-flammable and of low toxicity to the environment. The stripping compositions evidence higher stripping efficiency at low temperatures for a wide variety of coatings and substrates. They are particularly suitable for removal of photoresists and residues from plasma processing used in integrated circuit fabrication.

The stripping compositions are easily prepared by simply mixing the components at room temperature.

The method of the invention is carried out by contacting an organic or metal-organic polymer, inorganic salt, oxide, hydroxide or complex or combination thereof as a film or residue, (i.e. sidewall polymer (SWP)), with the described stripping composition. The actual conditions, i.e., temperature, time, etc. depend on the nature and thickness of the complex (photoresist and/or sidewall polymer) material to be removed, as well as other factors familiar to those skilled in the art. In general, for photoresist stripping, the photoresist is contacted or dipped into a vessel containing the stripping composition at a temperature between 25–85° C. typically for a period of about 5–30 minutes typically, washed with water and then dried with an inert gas or "spin dried".

Examples of organic polymeric materials include photoresists, electron beam resists, X-ray resists, ion beam resists, and the like. Specific examples of organic polymeric materials include positive resists containing phenol formaldehyde type resins or poly (p-vinylphenol), polymethylmethacrylate-containing resists, and the like. Examples of plasma processing residues (sidewall polymer) include among others; metal-organic complexes and/or inorganic salts, oxides, hydroxides or complexes which form films or residues either alone or in combination with the organic polymer resins of a photoresist. The organic materials and/or SWP can be removed from conventional substrates known to those skilled in the art, such as silicon, silicon dioxide, boron phosphorous silicon glass (BPSG), aluminum, aluminum alloys, copper, copper alloys, titanium, tungsten, metal nitrides, etc.

The effectiveness and unexpected nature of the stripping compositions of the invention is illustrated, but not limited by, the data presented in the following examples. Unless otherwise specified, all parts and percentages are by weight.

EXAMPLE 1

In order to demonstrate the efficacy of the different concentrations of the stripping and cleaning compositions the following tests were conducted.

Copper/silicon wafer substrates containing commercial photoresists and plasma generated SWP residues labeled as "veils" were post-baked at 180° C. for 60 minutes. The substrates were cooled and dipped into vessels containing a stripping composition and stirred with a magnetic stirrer. There was a vessel containing a stripping composition maintained at a temperature of 50° C. and another at 55° C. The contact time with the compositions was 20 to 30 minutes. The substrates were washed with deionized water and dried with nitrogen.

EXAMPLE 1

| | % Wt Sample No. | | | | | |
|---|---|---|---|---|---|---|
| Ingredient | 1 | 2 | 3 | 4 | 5 | 7 |
| MEA | | | | | | 58.0 |
| NMEA | 78.0 | 78.0 | 78.0 | 78.0 | 79.0 | |
| Benzotriazole | | 1.0 | | | 1.0 | |
| Water | 20.0 | 20.0 | 22.0 | 20.0 | 20.0 | 18.0 |
| Catechol | 2.0 | | | | | 5.0 |
| Gallic Acid | | 1.0 | | 2.0 | | |
| Hydroxylamine | | | | | | 18.0 |

Results

Sample 3 showed severe corrosion in VIAS. Samples 1 and 4 showed some SWP residue and corrosion.

Figure 2:
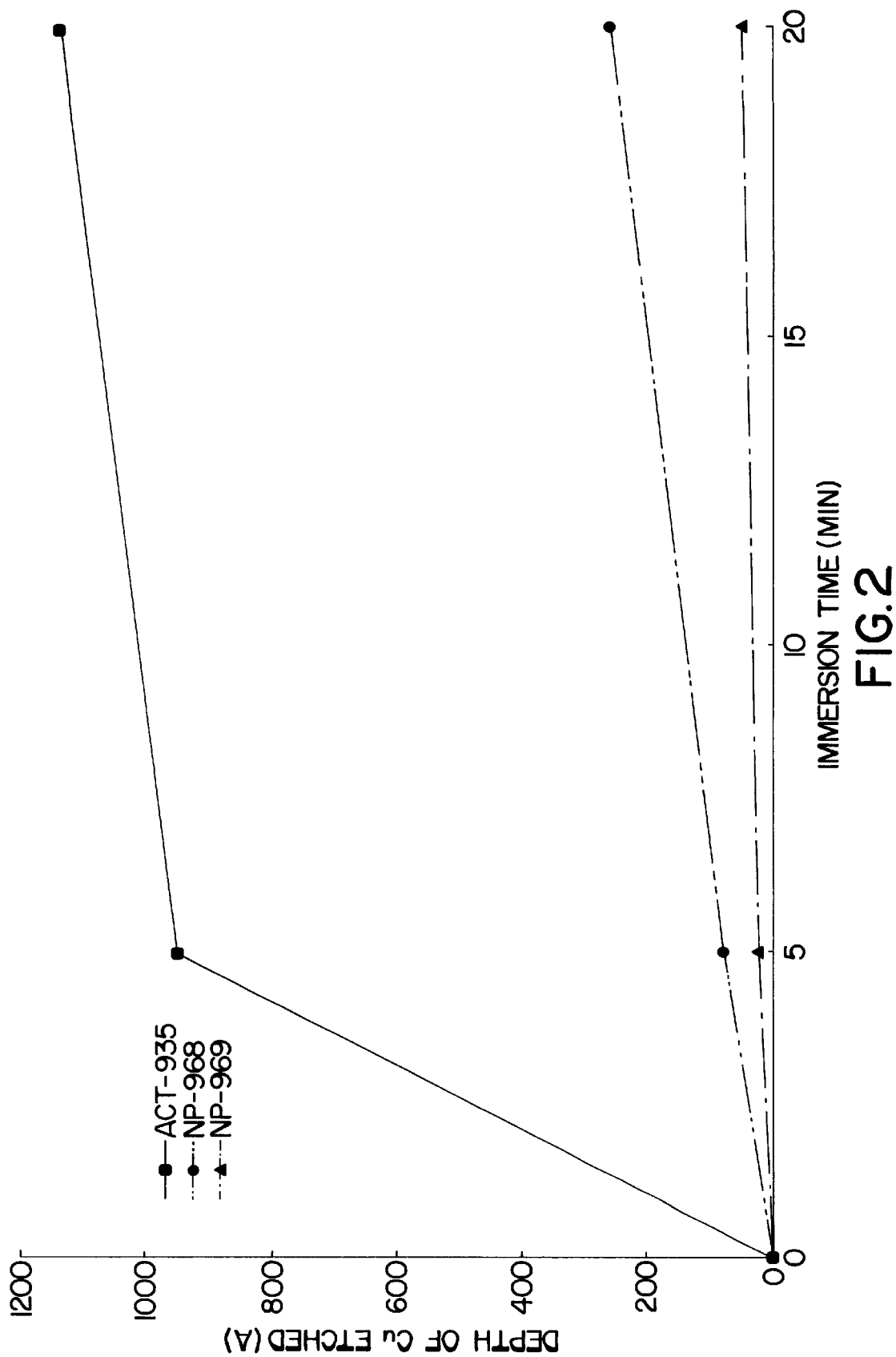
FIG. 2 shows a comparison of the sputtered copper etch rates for compositions of the invention and a composition containing hydroxylamine and an inhibitor at 75° C.

A comparison of the sputtered copper etch rates at 75° C. for Samples 2, 5 and 7 by measuring the metal content in solution is shown in FIG. 2.

A comparison of the sputtered copper etch rate at 75° C. and 85° C. for Samples 2 and 5 by the direct electrical measurement of film thickness is shown in FIG. 1.

The use of benzotriazole alone as an inhibitor is effective but the combination with gallic acid provided greater corrosion protection for copper containing substrates.

EXAMPLE 2

The following stripping and cleaning compositions were prepared and tested according to the test of Example 1.

| | | Time (min) | Temp.° C. | % Polymeric Removal | Corrosion |
|---|---|---|---|---|---|
| Composition 1 | | | | | |
| Monoethanolamine | 70 | 20 | 65 | 100 | No |
| Water | 28.0 | 20 | 90 | 100 | No |
| Benzotriazole | 1.0 | | | | |
| Gallic Acid | 1.0 | | | | |
| Composition 2 | | | | | |
| AEE | 70 | 20 | 65 | 100 | No |
| Water | 29.0 | 20 | 90 | 100 | No |
| Benzotriazole | 2 | | | | |
| Composition 3 | | | | | |
| AEE | 60 | 20 | 65 | 100 | No |
| Water | 28.0 | 20 | 90 | 100 | No |
| Gallic Acid | 1.0 | | | | |
| Benzotriazole | 1.0 | | | | |
| Composition 4 | | | | | |
| Morpholine | 60 | 20 | 65 | 100 | No |
| Water | 28.0 | 20 | 90 | 100 | No |
| Gallic Acid | 1.0 | | | | |
| Benzotriazole | 1.0 | | | | |

What is claimed is:

1. A hydroxlamine free photoresist stripping and cleaning composition comprising about 70 to 85% by weight of an alkanolamine, about 0.5 to 2.5% by weight of benzotriazole, about 0.5 to 2.5% by weight of gallic acid and the remainder being water.

2. The stripping and cleaning composition of claim 1 wherein said alkanolamine is N-methylethanolamine.

3. A process for removing a coating from a coated substrate comprising applying to said coated substrate a stripping and cleaning effective amount of the composition of claim 1, permitting said stripping composition to reside on said coated substrate for a stripping effective period of time and removing the coating from said substrate.

* * * * *